(12) United States Patent
Cao et al.

(10) Patent No.: US 10,551,709 B2
(45) Date of Patent: Feb. 4, 2020

(54) DISPLAY PANEL HAVING AN OPPOSING SUBSTRATE PROVIDED WITH A GATE ELECTRODE, MANUFACTURING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Ke Cao, Beijing (CN); Chengshao Yang, Beijing (CN); Binbin Cao, Beijing (CN); Ling Han, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/747,694

(22) PCT Filed: Jun. 28, 2017

(86) PCT No.: PCT/CN2017/090556
§ 371 (c)(1),
(2) Date: Jan. 25, 2018

(87) PCT Pub. No.: WO2018/120695
PCT Pub. Date: Jul. 5, 2018

(65) Prior Publication Data
US 2019/0004351 A1    Jan. 3, 2019

(30) Foreign Application Priority Data
Dec. 26, 2016 (CN) .......................... 2016 1 1220093

(51) Int. Cl.
*H01L 27/12* (2006.01)
*G02F 1/1368* (2006.01)
(Continued)

(52) U.S. Cl.
CPC ........ *G02F 1/1368* (2013.01); *G02F 1/13394* (2013.01); *G02F 1/133345* (2013.01);
(Continued)

(58) Field of Classification Search
CPC ............. H01L 27/1218; H01L 27/1251; H01L 27/1248
See application file for complete search history.

(56) References Cited

U.S. PATENT DOCUMENTS 8,304,300 B2* 11/2012 Sakata ............. H01L 21/02554
438/157
2010/0238391 A1* 9/2010 Yamazaki ............. G02F 1/1368
349/140
(Continued)

FOREIGN PATENT DOCUMENTS

CN     103346093 A     10/2013
CN     103531609 A      1/2014
(Continued)

OTHER PUBLICATIONS

International Search Report and Written Opinion dated Sep. 28, 2017; PCT/CN2017/090556.

*Primary Examiner* — Daniel Whalen
*Assistant Examiner* — Suberr L Chi

(57) ABSTRACT

A display panel, a manufacturing method thereof and a display device are provided. The display panel includes an array substrate and an opposing substrate which are disposed opposite to each other; the array substrate includes a first base substrate and a source electrode, a drain electrode and an active layer which are disposed on the first base substrate,
(Continued)

and a passivation layer disposed on the source electrode, the drain electrode and the active layer; the opposing substrate includes a second base substrate and a gate electrode disposed on the second base substrate; the active layer includes a source electrode region, a drain electrode region and a channel region between the source electrode region and the drain electrode region, the gate electrode is disposed opposite to and spaced apart from the passivation layer at a position where the channel region is located.

18 Claims, 4 Drawing Sheets

(51) Int. Cl.
| | |
|---|---|
| *H01L 29/423* | (2006.01) |
| *H01L 29/786* | (2006.01) |
| *G02F 1/1339* | (2006.01) |
| *G02F 1/1335* | (2006.01) |
| *G02F 1/1362* | (2006.01) |
| *G02F 1/1333* | (2006.01) |

(52) U.S. Cl.
CPC .. *G02F 1/133512* (2013.01); *G02F 1/133516* (2013.01); *G02F 1/136286* (2013.01); *H01L 27/124* (2013.01); *H01L 27/1218* (2013.01); *H01L 27/1248* (2013.01); *H01L 27/1262* (2013.01); *H01L 29/42384* (2013.01); *H01L 29/78696* (2013.01); *G02F 1/136227* (2013.01); *G02F 2001/13396* (2013.01); *G02F 2001/13398* (2013.01); *G02F 2001/13685* (2013.01); *G02F 2001/136295* (2013.01)

(56) References Cited

U.S. PATENT DOCUMENTS

2017/0053953 A1\* 2/2017 Hirota ................. H01L 27/1262
2017/0263655 A1\* 9/2017 Shen .................... H01L 27/1288

FOREIGN PATENT DOCUMENTS

| | | |
|---|---|---|
| CN | 104934330 A | 9/2015 |
| CN | 105977263 A | 9/2016 |
| CN | 106773205 A | 5/2017 |
| KR | 20140034628 A | 3/2014 |

\* cited by examiner

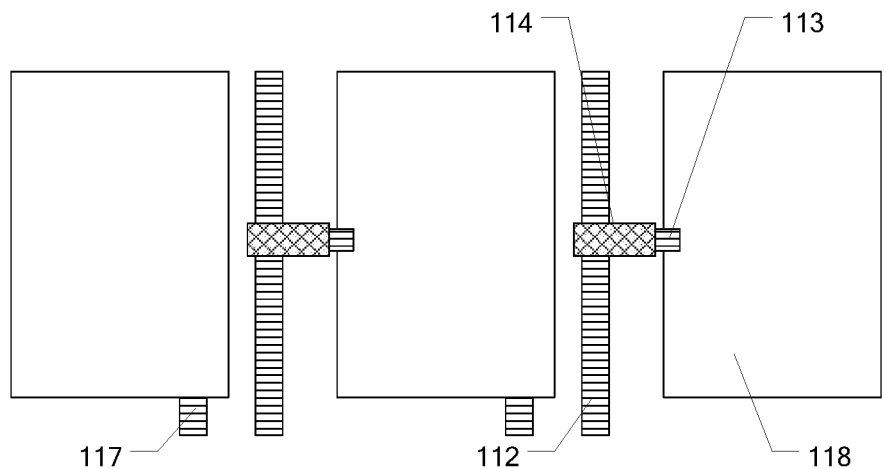

FIG. 4

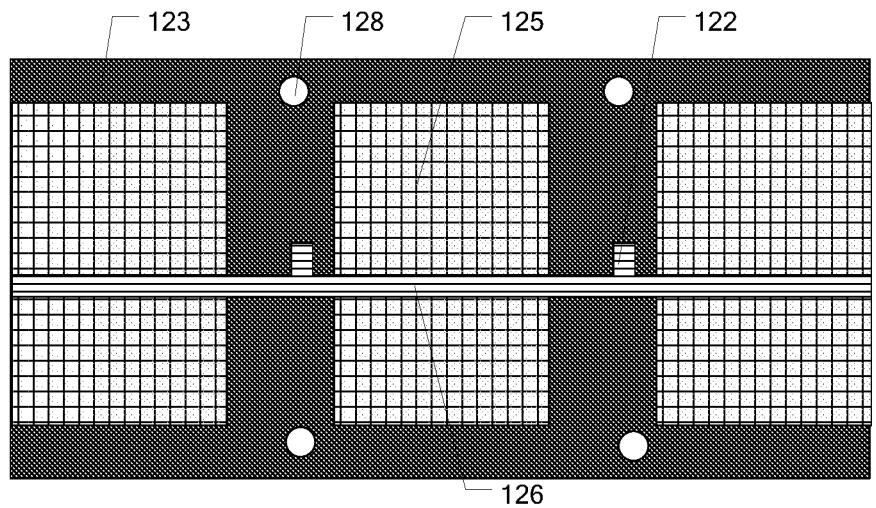

FIG. 5

| forming a source electrode, a drain electrode, an active layer and a passivation layer on a first base substrate to form an array substrate, the active layer comprises a source electrode region, a drain electrode region and a channel region between the source electrode region and the drain electrode region | ∽ S201 |

↓

| forming a gate electrode on a second base substrate to form an opposing substrate | ∽ S202 |

↓

| cell-assembling the array substrate and the opposing substrate, and making a side of the first base substrate on which the source electrode, the drain electrode, the active layer and the passivation layer are formed face a side of the second base substrate on which the gate electrode is formed, the gate electrode is disposed opposite to and spaced apart from the passivation layer at a position where the channel region is located | ∽ S203 |

DISPLAY PANEL HAVING AN OPPOSING SUBSTRATE PROVIDED WITH A GATE ELECTRODE, MANUFACTURING METHOD THEREOF, AND DISPLAY DEVICE

TECHNICAL FIELD

Embodiments of the present disclosure relate to a display panel, a manufacturing method thereof and a display device.

BACKGROUND

With the continuous development of display technology, curved display panel is more and more popular. In general, the entire screen of the curved display panel is in an arc shape surrounding and orienting toward the user to provide a wide panoramic image effect. Compared with the flat display panel, in addition to the screen center of the display panel, the screen edge of the curved display panel can also provide a better viewing effect.

In general, a curved liquid crystal display panel is manufactured by first manufacturing a flat liquid crystal display panel, and then curving the flat liquid crystal display panel. A liquid crystal display panel includes an array substrate, a color filter substrate and a liquid crystal layer disposed between the array substrate and the color filter substrate. The array substrate includes a base substrate, a thin film transistor array including a gate electrode, a gate insulator layer, an active layer, a source electrode and a drain electrode and so on, which are disposed on the base substrate, and a pixel electrode and the like. The color filter substrate includes a base substrate, a color filter, a black matrix and the like which are disposed on the base substrate.

SUMMARY

At least one embodiment of the present disclosure provides a display panel, a manufacturing method thereof and a display panel. The display panel includes an array substrate and an opposing substrate which are disposed opposite to and spaced apart from each other; the array substrate includes a first base substrate and a source electrode, a drain electrode and an active layer which are disposed on the first base substrate, and a passivation layer disposed on the source electrode, the drain electrode and the active layer; the opposing substrate includes a second base substrate and a gate electrode disposed on the second base substrate; the active layer includes a source electrode region, a drain electrode region and a channel region between the source electrode region and the drain electrode region, the gate electrode is disposed opposite to and spaced apart from the passivation layer at a position where the channel region is located. Therefore, the display panel can be configured to form a curved display panel with higher yield and quality.

At least one embodiment of present disclosure provides a display panel, which includes: an array substrate, includes a first base substrate and a source electrode, a drain electrode and an active layer which are disposed on the first base substrate, and a passivation layer disposed on the source electrode, the drain electrode and the active layer; and an opposing substrate, disposed opposite to and spaced apart from the array substrate and including a second base substrate, the active layer includes a source electrode region, a drain electrode region and a channel region between the source electrode region and the drain electrode region, the opposing substrate further includes a gate electrode disposed on the second base substrate, the gate electrode is disposed opposite to and spaced apart from the passivation layer at a position where the channel region is located.

For example, in the display panel provided by an embodiment of the present disclosure, the display panel is configured to be curved so as to decrease a space between the gate electrode and the passivation layer at the position where the channel region is located.

For example, in the display panel provided by an embodiment of the present disclosure, the opposing substrate further includes: a protective layer, disposed on a side of the gate electrode close to the array substrate, the protective layer at a position where the gate electrode is located is disposed opposite to and spaced apart from the passivation layer at the position where the channel region is located.

For example, in the display panel provided by an embodiment of the present disclosure, the display panel is configured to be curved so that the protective layer at the position where the gate electrode is located is disposed in contact with the passivation layer at the position where the channel region is located.

For example, in the display panel provided by an embodiment of the present disclosure, the protective layer at the position where the gate electrode is located is protruded from the opposing substrate and forms a protrusion, the passivation layer at the position where the channel region is located is concave to the first base substrate and forms a groove, the protrusion is configured to be inserted into the groove.

For example, in the display panel provided by an embodiment of the present disclosure, the opposing substrate further includes: a plurality of color filters; and a black matrix, the black matrix is disposed around each of the color filters, an orthogonal projection of the gate electrode on the second base substrate falls within an orthogonal projection of the black matrix on the second base substrate.

For example, in the display panel provided by an embodiment of the present disclosure, the plurality of color filters is arranged in an array, the opposing substrate further includes: a gate line, extending along a row direction of the array, and the gate line is overlapped with the color filters.

For example, in the display panel provided by an embodiment of the present disclosure, the opposing substrate further includes: a spacer, an orthogonal projection of the spacer on the second base substrate falls within the orthogonal projection of the black matrix on the second base substrate.

For example, at least one embodiment of the present disclosure provides a manufacturing method of a display panel, which includes: forming a source electrode, a drain electrode, an active layer and a passivation layer on a first base substrate to form an array substrate, the active layer includes a source electrode region, a drain electrode region and a channel region between the source electrode region and the drain electrode region; forming a gate electrode on a second base substrate to form an opposing substrate; and cell-assembling the array substrate and the opposing substrate, and making a side of the first base substrate on which the source electrode, the drain electrode, the active layer and the passivation layer are formed face a side of the second base substrate on which the gate electrode is formed, the gate electrode is disposed opposite to and spaced apart from the passivation layer at a position where the channel region is located.

For example, the manufacturing method of the display panel provided by an embodiment of the present disclosure further includes: curving the display panel to form a curved display panel so as to decrease a space between the gate electrode and the passivation layer at the position where the channel region is located.

For example, the manufacturing method of the display panel provided by an embodiment of the present disclosure further includes: before curving the display panel to form the curved display panel, forming a protective layer on a side of the gate electrode away from the second base substrate, the protective layer at a position where the gate electrode is located is disposed opposite to and spaced apart from the passivation layer at the position where the channel is located.

For example, in the manufacturing method of the display panel provided by an embodiment of the present disclosure, curving the display panel to form the curved display panel so as to decrease the space between the gate electrode and the passivation layer at the position where the channel region is located specifically includes: curving the display panel to form the curved display panel so that the protective layer at the position where the gate electrode is located is disposed in contact with the passivation layer at the position where the channel region is located.

For example, in the manufacturing method of the display panel provided by an embodiment of the present disclosure, curving the display panel to form the curved display panel so as to decrease the space between the gate electrode and the passivation layer at the position where the channel region is located includes: according to an electrical property of the source electrode, the drain electrode and the active layer, controlling a curving degree of the display panel upon the display panel being curved.

For example, in the manufacturing method of the display panel provided by an embodiment of the present disclosure, cell-assembling the array substrate and the opposing substrate is performed in a vacuum environment.

For example, at least one embodiment of the present disclosure provides a display device, which includes any one of the abovementioned display panel.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIG. 4 is a planar view of an array substrate of a display panel provided by an embodiment of the present disclosure;

FIG. 5 is a planar view of an opposing substrate of a display panel provided by an embodiment of the present disclosure;

FIG. 6 is a flow diagram of a manufacturing method of a display panel provided by an embodiment of the present disclosure;

DETAILED DESCRIPTION

Figure 1:
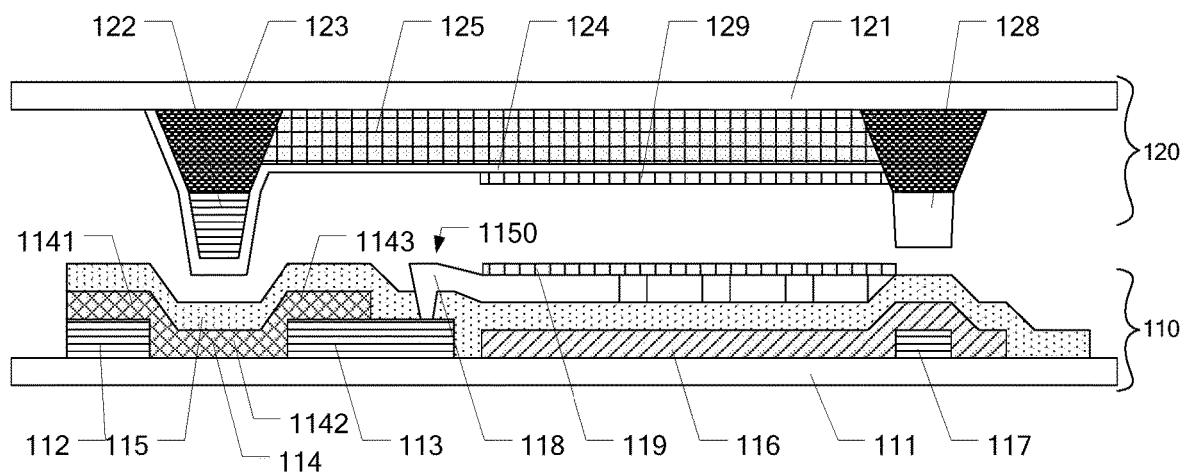
FIG. 1 is a structural schematic diagram of a display panel provided by an embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used in the present disclosure have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "includes", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In a study, the inventor(s) of the present application has found that in a manufacturing process of a curved liquid crystal display panel, it is needed to focus on monitoring a space between an array substrate and an opposing substrate (that is, an upper substrate and a lower substrate) and a liquid crystal amount upon the array substrate and the opposing substrate being curved; a tiny change in parameters may change the display effect of the curved liquid crystal display panel. However, various parameters (such as the space between the array substrate and the opposing substrate, and the liquid crystal amount) of an ordinary curved liquid crystal display panel are complicated and difficult to control. Therefore, the inventor(s) of the present application has thought that forming a gate electrode on the opposing substrate, after determining an optimal curving degree, a distance between the gate electrode and the array substrate can be set to provide an optimal display effect for a curved display panel; or, an optimal effect can be ensured by adjusting the curving degree under a condition that the distance between the gate electrode and the array substrate is fixed, so that the control range of various parameters can be greatly increased so that the yield of the product is higher.

At least one embodiment of the present disclosure provides a display panel, a manufacturing method thereof and a display device. The display panel includes an array substrate and an opposing substrate which are disposed opposite to and spaced apart from each other; the array substrate includes a first base substrate and a source electrode, a drain electrode and an active layer which are disposed on the first base substrate, and a passivation layer disposed on the source electrode, the drain electrode and the active layer; the opposing substrate includes a second base substrate and a gate electrode disposed on the second base substrate; the active layer includes a source electrode region, a drain electrode region and a channel region between the source electrode region and the drain electrode region, the gate electrode is disposed opposite to and spaced apart from the passivation layer at a position where the channel region is located. Therefore, the display panel can be configured to form a curved display panel with higher yield and quality.

Hereafter, the display panel, the manufacturing method thereof and the display device provided in the embodiments of the present disclosure will be described below with reference to the accompanying drawings.

First Embodiment

The present embodiment provides a display panel, as illustrated in FIG. 1, the display panel includes an array substrate 110 and an opposing substrate 120 which are disposed opposite to each other. The array substrate 110 includes a first base substrate 111 and a source electrode 112, a drain electrode 113 and an active layer 114 which are disposed on the first base substrate 111, and a passivation layer 115 disposed on the source electrode 112, the drain electrode 113 and the active layer 114. The opposing substrate 120 includes a second base substrate 121 and a gate electrode 122 disposed on the second base substrate 121. The active layer 114 includes a source electrode region 1141, a drain electrode region 1143 and a channel region 1142 between the source electrode region 1141 and the drain electrode region 1143, the gate electrode 122 is disposed opposite to and spaced apart from the passivation layer 115 at a position where the channel region 1142 is located, that is, the gate electrode 122 is disposed opposite to and spaced apart from a surface of the array substrate 110 which is close to the opposing substrate 120 at the position where the channel region 1142 is located. It should be noted that, the "opposite" as mentioned above refers to that the gate electrode and the channel region are approximately disposed opposite to each other rather than being strictly aligned, as long as the electric field generated by a curved gate electrode of the display panel can act on the channel region.

In the display panel provided by the present embodiment, the gate electrode is disposed opposite to and spaced apart from the passivation layer at the position where the channel region is located, the display panel can be configured to form a curved display panel. Upon the display panel being curved, a space between the array substrate and the opposing substrate is decreased, a space between the gate electrode and the passivation layer at the position where the channel region is located is decreased, the gate is close to the channel region and can act as a gate electrode, that is, the electric field generated by the gate electrode can act on the channel region. Therefore, in a case of determining an optimal curving degree, the distance between the gate electrode and the passivation layer can be set to make the curved display panel have the best display effect, for example, the distance between the gate electrode and the channel region in the curved display panel is exactly the distance with the best display effect; or, in a case that the distance between the gate electrode and the passivation layer is fixed, the best effect can be ensured by adjusting the curving degree, so that the control range of various parameters can be greatly increased so that the yield of the product is higher.

For example, in the display panel provided by an example of the present embodiment, as illustrated in FIG. 1, the opposing substrate 120 further includes a protective layer 124 disposed on a side of the gate electrode 122 close to the array substrate 110 (or away from the second base substrate 121), the protective layer 124 at the position where the gate electrode 122 is located is disposed opposite to and spaced apart from the passivation layer 115 at the position where the channel region 1142 is located, that is, the protective layer 124 at the position where the gate electrode 122 is located is disposed opposite to and spaced apart from a surface of the array substrate 110 which is close to the opposing substrate 120 at the position where the channel region 1142 is located. Therefore, the protection layer is capable of playing a role of protecting the gate electrode, for example, the protective layer is configured to prevent the gate electrode from being etched or oxidized by the liquid crystal.

For example, the material of the first base substrate and the second base substrate can include a glass substrate, a quartz substrate, a resin substrate and so on. The material of the gate electrode can include one or more selected from a group consisting of chromium, molybdenum, aluminum, copper, aluminum alloy, copper alloy, and the like. The material of the active layer can include oxide semiconductor, amorphous silicon, polysilicon, or other semiconductor materials.

Figure 2:
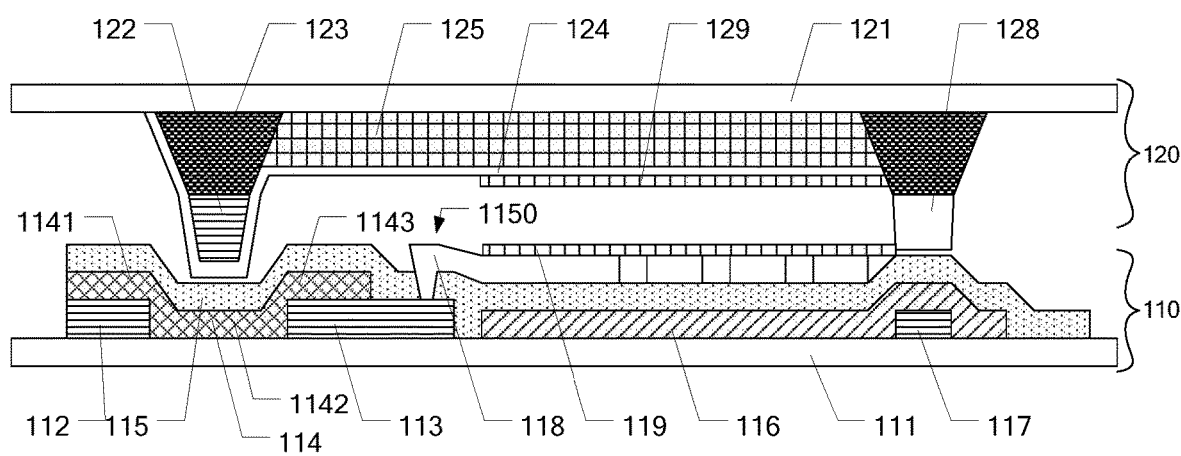
FIG. 2 is a structural schematic diagram of another display panel provided by an embodiment of the present disclosure.

For example, in the display panel provided by an example of the present embodiment, as illustrated in FIG. 2, the display panel is configured to be curved so as to decrease a space between the gate electrode 122 (or the protective layer 124 at the position where the gate electrode 122 is located) and the passivation layer 115 at the position where the channel region 114 is located. Therefore, the display panel can be configured to form a curved display panel.

Figure 3:
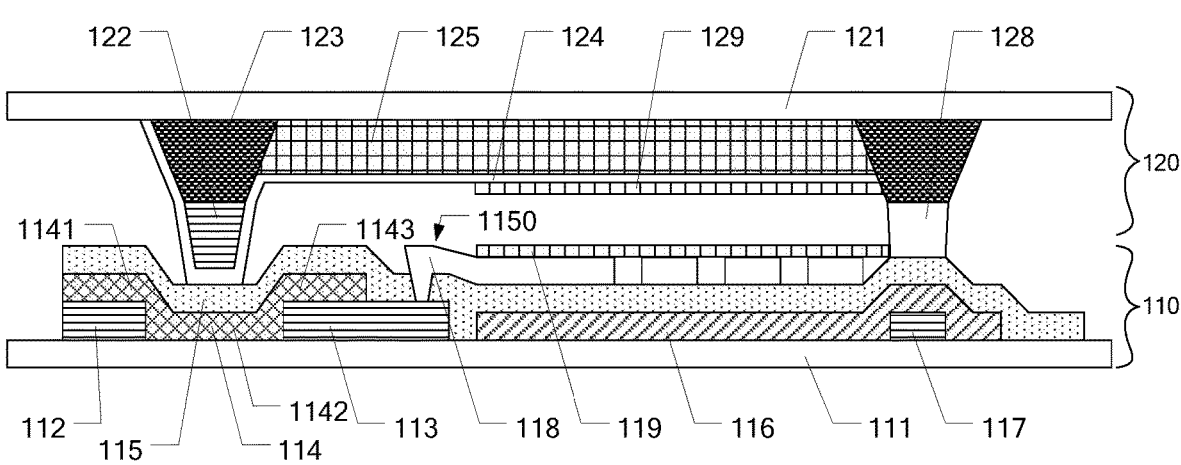
FIG. 3 is a structural schematic diagram of another display panel provided by an embodiment of the present disclosure.

For example, in the display panel provided by an example of the present disclosure, as illustrated in FIG. 3, the display panel is configured to be curved so that the protective layer 124 at the position where the gate electrode 122 is located is in contact with the passivation layer 115 at the position where the channel region 114 is located. In this case, the space between the gate electrode 122 and the channel region 144 is the least, the electric field generated by the gate electrode 122 has the largest effect on the channel region 114, and the gate electrode 122 can play a role that maintain the thickness of the liquid crystal cell formed by the array substrate 110 and the opposing substrate 120 so as to increase the stability of the display panel.

For example, in the display panel provided by an example of the present embodiment, as illustrated in FIG. 1 to FIG. 3, the protective layer 124 at the position where the gate electrode 122 is located is protruded from the opposing substrate 120 and forms a protrusion, the passivation layer 115 at the position where the channel region 114 is located is concave to the first base substrate 111 and forms a groove, the protrusion can be inserted into the groove. Therefore, when the display panel is curved, the protrusion formed by the protective layer at the position where the gate electrode is located protruding from the opposing substrate can be inserted into the groove formed by a surface of the array substrate which is close to the opposing substrate at the position where the channel region is located concaving to the first base substrate, so that a relative position of the gate electrode and the channel region can be fixed to further improve the stability of the display panel.

For example, in the display panel provided by an example of the present embodiment, as illustrated in FIG. 1 to FIG. 3, the source electrode 112 and the drain electrode 113 are disposed on a side of the first base substrate 111 close to the opposing substrate 120, the active layer 114 is disposed on the source electrode 113, the drain electrode 114 and the first base substrate 111, the source electrode region 1141 is electrically connected with the source electrode 112, the drain electrode region 1143 is connected with the drain electrode 113. The gate electrode 122 is disposed opposite to and spaced apart from the channel region 1142. Upon the display panel being curved, the gate electrode 122, the source electrode 112, the drain electrode 113 and the active layer 114 can form a thin film transistor structure.

For example, in the display panel provided by an example of the present embodiment, as illustrated in FIG. 1 to FIG. 3, the array substrate 110 further includes a common electrode 116 disposed on the first base substrate 111, a passivation layer 115 disposed on the source electrode 112, the drain electrode 113, the source electrode 114 and the common electrode 116, a via hole 1150 which is disposed in the passivation layer 115 and exposes a portion of the drain electrode 113, and a pixel electrode 118 which is disposed on the passivation layer 115 and electrically connected with the drain electrode 113 through the via hole 1150.

For example, as illustrated in FIG. 1 to FIG. 3, the array substrate 110 further includes a common electrode line 117 disposed on the first base substrate 111, the common electrode 116 is electrically connected with the common electrode line 117.

For example, the display panel further includes a liquid crystal layer (not shown) disposed between the array substrate and the opposing substrate, the pixel electrode and the common electrode can generate an electric field to drive the liquid crystal in the liquid crystal layer to deflect to achieve the display function.

For example, the material of the common electrode and the pixel electrode can include a metal or a transparent oxide material. The material of the passivation layer can be an inorganic insulating material such as SiO or SiNO, or an organic insulating material such as organic glass, polyimide and the like.

For example, in the display panel provided by an example of the present embodiment, as illustrated in FIG. 1 to FIG. 3, the array substrate 110 further includes a first alignment film 119 disposed on the pixel electrode 118, the first alignment film 119 is configured to align liquid crystal molecules.

For example, in the display panel provided by an example of the present embodiment, as illustrated in FIG. 1 to FIG. 3, the opposing substrate 120 further includes a plurality of color filters 125 and a black matrix 123. The black matrix 123 is disposed around each of the color filters 125, an orthogonal projection of the gate electrode 122 on the second base substrate 121 falls within an orthogonal projection of the black matrix 123 on the second base substrate 121, that is, the gate electrode 122 is disposed on a side of the black matrix 123 close to the array substrate 110. Therefore, the gate electrode 122 disposed on the opposing substrate 120 cannot influence the aperture ratio of the display panel. In addition, the gate electrode 122 disposed on the side of the black matrix 123 close to the array substrate 110, in this way, it is convenient for the protective layer 124 at the position where the gate electrode 122 is located to form a protrusion protruding toward the array substrate 110. Of course, embodiments of the present disclosure include but are not limited thereto, the orthogonal of the gate electrode on the second base substrate can also not fall within the orthogonal of the black matrix on the second base substrate.

For example, the plurality of color filters can include a blue color filter, a red color filter and a green color filter. Of course, embodiments of the present disclosure include but are not limited thereto.

For example, in the display panel provided by an example of the present disclosure, as illustrated in FIG. 1 to FIG. 3, the opposing substrate 120 further includes a spacer 128. An orthogonal projection of the spacer 128 on the second base substrate 121 falls within the orthogonal projection of the black matrix 123 on the second base substrate 121. That is, the spacer 125 is disposed on the side of the black matrix 123 close to the array substrate 110. Therefore, the spacer 128 cannot influence the aperture ratio of the display panel. In addition, because the black matrix 123 has a certain height relative to the second base substrate 121, the spacer 128 is disposed on the side of the black matrix 123 close to the array substrate 110 to reduce the height of the spacer while maintaining the same cell thickness. Of course, embodiments of the present disclosure include but are not limited thereto, the orthogonal of the spacer on the second base substrate also cannot fall with in the orthogonal of the black matrix on the second base substrate.

For example, in the display device provided by an example of the present embodiment, as illustrated in FIG. 1 to FIG. 3, the opposing substrate 120 further includes a second alignment film 129, disposed on a side of the protective layer 124 close to the array substrate 110.

For example, as illustrated in FIG. 1 to FIG. 3, the first alignment film 119 and the second alignment film 129 are disposed oppositely and disposed only in a region corresponding to the pixel electrode 118, a region corresponding to the gate electrode 122 and the channel region 1142 is not provided with the first alignment film 119 and the second alignment film 129. Of course, embodiments of the present disclosure include but are not limited thereto, the first alignment film 119 and the second alignment film 129 can also be disposed in the region corresponding to the gate electrode 122 and the channel region 1142.

For example, on the array substrate of the display panel provided by an example of the present embodiment, as illustrated in FIG. 4, a plurality of the pixel electrodes 118 is arranged in an array, the active layer 114, the source electrode 112 and the drain electrode 113 are disposed on a side of the pixel electrode 118, and located at an intermediate position of each of the pixel electrodes 118 in a column direction. It should be noted that, the intermediate position as mentioned above include but is not limited to a midpoint of the pixel electrode in the column direction.

For example, on the opposing substrate of the display panel provided by an example of the present embodiment, as illustrated in FIG. 5, the plurality of color filters 125 is arranged in an array, the opposing substrate 120 further includes a gate line 126 extending along a row direction of the array, and the gate line 126 overlaps with the color filters 125.

For example, as illustrated in FIG. 5, the spacer 128 is disposed in a region close to a corner of the color filters 125. Therefore, the spacer 128 can better maintain the cell thickness.

Second Embodiment

The present embodiment provides a manufacturing method of a display panel, as illustrated in FIG. 6, the method includes steps of S201-S203.

Step S201: forming a source electrode, a drain electrode, an active layer and a passivation layer on a first base substrate to form an array substrate, the active layer includes a source electrode region, a drain electrode region and a channel region between the source electrode region and the drain electrode region.

Step S202: forming a gate electrode on a second base substrate to form an opposing substrate.

Step S203: cell-assembling the array substrate and the opposing substrate, and making a side of the first base substrate on which the source electrode, the drain electrode, the active layer and the passivation layer are formed face a side of the second base substrate on which the gate electrode is formed, the gate electrode is disposed opposite to and spaced apart from the passivation layer at a position where the channel region is located.

In the manufacturing method of the display panel provided by the present embodiment, the gate electrode is formed on the opposing substrate, and the gate electrode is spaced apart from the passivation layer at the position where the channel region is located, the display panel can be configured to form a curved display panel. Upon the display panel being curved, a space between the array substrate and the opposing substrate is decreased, a distance between the gate electrode and the passivation layer at the position where the channel region is located is decreased, the gate electrode is close to the channel region and can act as a gate electrode. Therefore, in a case of determining an optimal curving degree, the distance between the gate electrode and the passivation layer can be set to make the curved display panel have the best display effect, for example, the distance between the gate electrode and the channel region in the curved display panel is exactly the distance with the best display effect; or, in a case that the distance between the gate electrode and the passivation layer is fixed, the best effect can be ensured by adjusting the curving degree, so that the control range of various parameters can be greatly increased so that the yield of the product is higher.

For example, the manufacturing method of the display panel provided by an example of the present embodiment can further include: forming a protective layer on a side of the gate electrode away from the second base substrate, the protective layer at the position where the gate electrode is located is disposed opposite to and spaced apart from the passivation layer at the position where the channel is located. Therefore, the protection layer is capable of playing a role of protecting the gate electrode, for example, the protective layer is configured to prevent the gate electrode from being etched or oxidized by the liquid crystal.

For example, a step of cell assemble can be performed in a vacuum environment, so that the yield of the manufacturing method can be further improved.

For example, in the manufacturing method of the display panel provided by an example of the present embodiment, which further includes curving the display panel as mentioned above to form a curved display panel so as to decrease a space between the gate electrode (or the protective layer at the position where the gate electrode is located) and the passivation layer at the position where the channel region is located. Therefore, after curving the display panel as mentioned above, the electric field generated by the gate electrode on the opposing substrate can act on the channel region on the array substrate, so that the gate electrode functions as a gate electrode. Besides, the electrical property of the thin film transistor including the gate electrode, the active layer, the source electrode and the drain electrode can be optimized by setting the curving degree so as to achieve the best display effect of the display panel.

In the manufacturing method of the display panel provided by an example of the present embodiment, which further includes: curving the display panel to form the curved display panel so that the gate electrode (or the protective layer at the position where the gate electrode is located) is disposed in contact with the passivation layer at the position where the channel region is located. At this point, the distance between the gate electrode and the channel region is the least, besides, the gate electrode can play a role that maintain the thickness of the liquid crystal cell formed by the array substrate and the opposing substrate so as to increase the stability of the display panel.

For example, in the manufacturing method of the display panel provided by an example of the present embodiment, which further includes: according to an electrical property of the source electrode, the drain electrode and the active layer, controlling the curving degree of the display panel in a case that the display panel is curved, so that the space between the gate electrode (or the protective layer at the position where the gate electrode is located) and the passivation layer at the position where the channel region is located is reduced or the gate electrode (or the protective layer at the position where the gate electrode is located) is disposed in contact with the passivation layer at the position where the channel region is located. Therefore, by controlling the curving degree of the display panel in a case that it is curved according to the electrical property of the source electrode, the drain electrode and the active layer, the distance between the gate electrode and the active layer can be controlled, so that the electrical property of the thin film transistor including the gate electrode, the active layer, the source electrode and the drain electrode can be optimized so as to achieve the best display effect of the display panel.

Figure 7A:
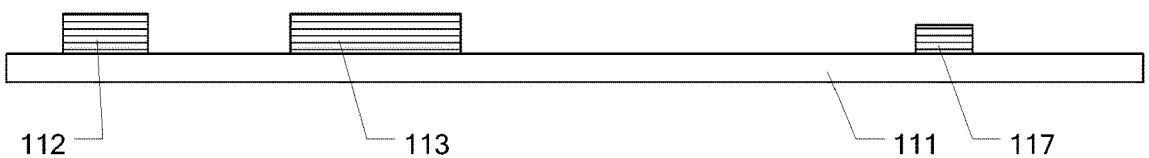
FIG. 7*a*-FIG. 7*e* are step diagrams of manufacturing an array substrate in a manufacturing method of a display device provided by an embodiment of the present disclosure.
Figure 7B:
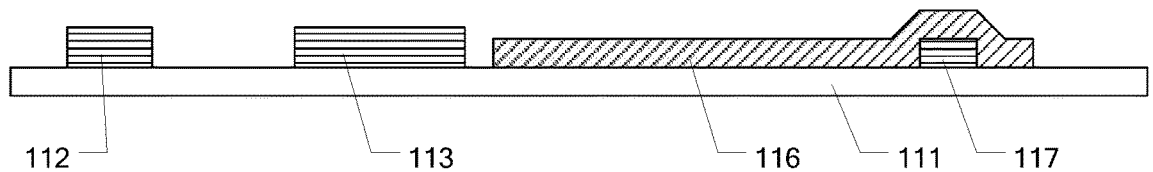
Figure 7C:
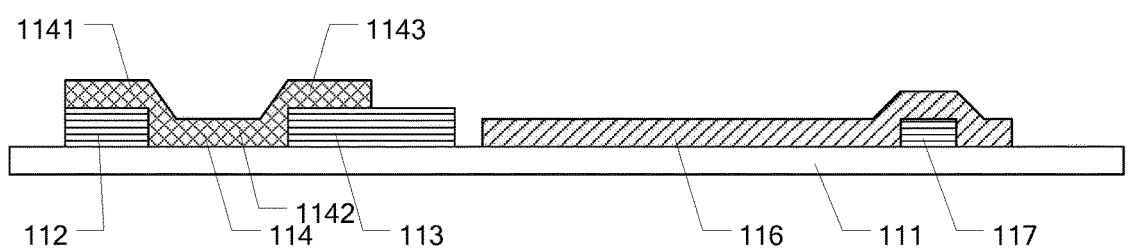
Figure 7D:
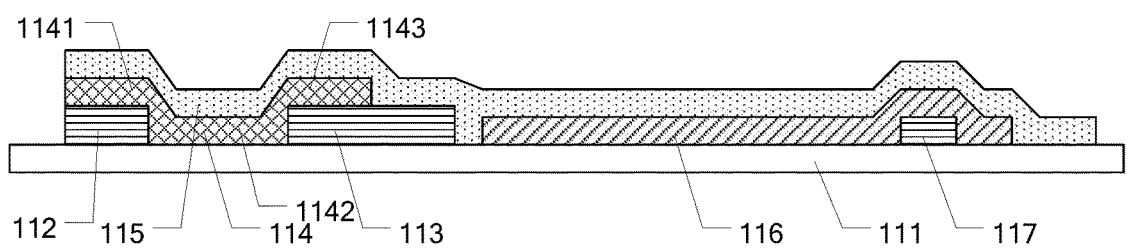
Figure 7E:
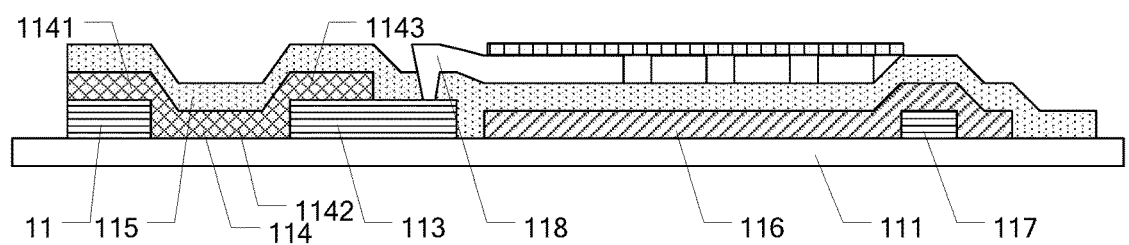

For example, the abovementioned step of forming the source electrode, the drain electrode and the active layer on the first base substrate to form the array substrate, the active layer includes the source electrode region, the drain electrode region and the channel region between the source electrode region and the drain electrode region can include: as illustrated in FIG. 7a, forming the source electrode 112, the drain electrode 113 and a common electrode line 117 on the first base substrate 111. As illustrated in FIG. 7b, forming a common electrode 116 on the first base substrate 111 and the common electrode line 117. As illustrated in FIG. 7c, forming the active layer 114 on the source electrode 112, the drain electrode 113 and the first base substrate 111. As illustrated in FIG. 7d, forming the passivation layer 115 on the array substrate illustrated in FIG. 7c. As illustrated in FIG. 7e, forming a via hole 1150 in the passivation layer 115 and forming a pixel electrode 118 on the passivation layer 115, the pixel electrode 118 is electrically connected with the drain electrode 113 through the via hole 1150.

Figure 8A:
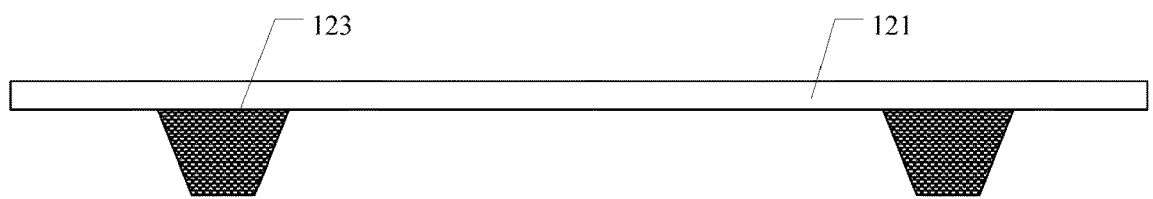
FIG. 8*a*-FIG. 8*e* are step diagrams of manufacturing an opposing substrate in a manufacturing method of a display device provided by an embodiment of the present disclosure.
Figure 8B:
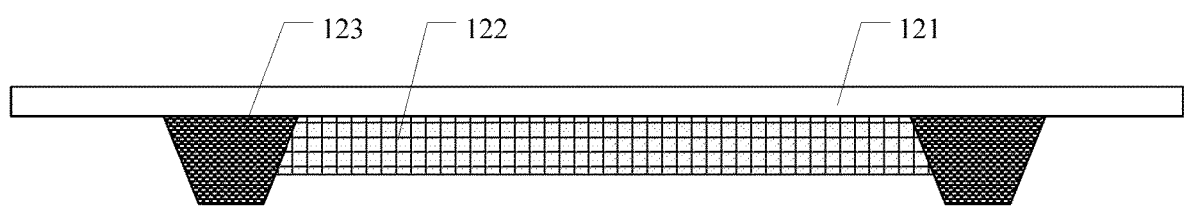
Figure 8C:
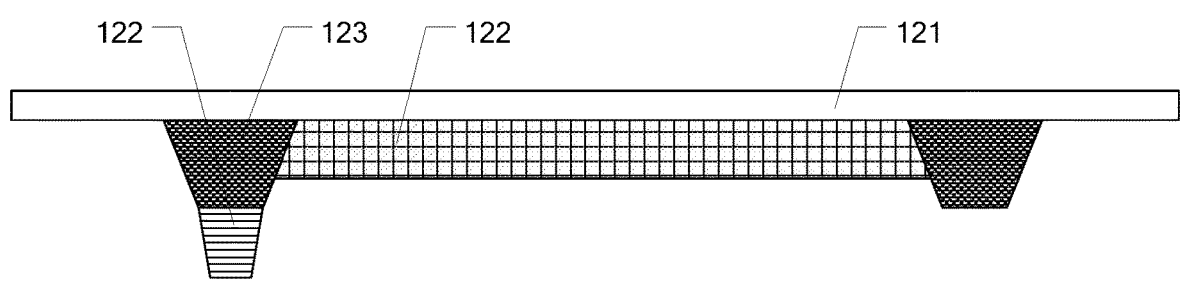
Figure 8D:
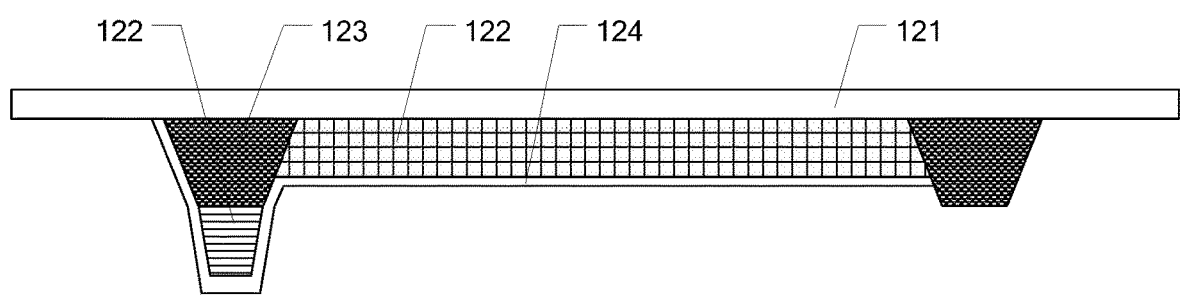
Figure 8E:
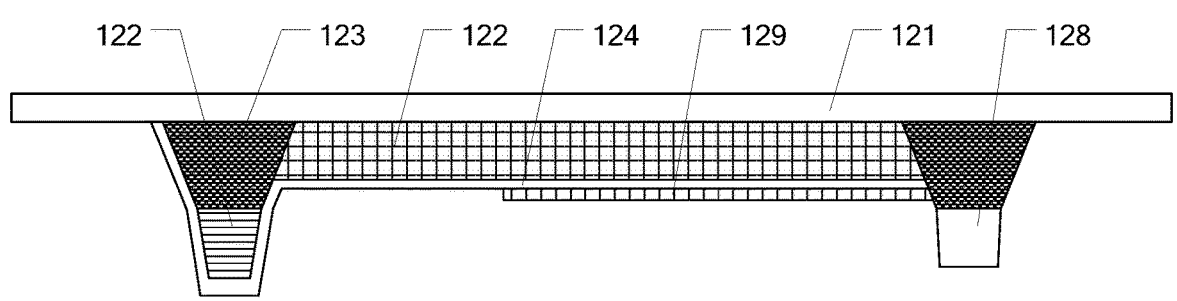

For example, the abovementioned step of forming the gate electrode and the protective layer on the second base substrate to form the opposing substrate, the protective layer is disposed on a side of the gate electrode close to the array substrate, the gate electrode is disposed opposite to and spaced apart from the channel region, the protective layer at the position where the gate electrode is located is spaced apart from a surface of the array substrate which is close to the opposing substrate at the position where the channel region is located can include: as illustrated in FIG. 8a, forming a black matrix 123 on the second base substrate 121. As illustrated in FIG. 8b, forming a color color filter 125 on the second base substrate 121. As illustrated in FIG. 8c, forming the gate electrode 122 on the black matrix 122. As illustrated in FIG. 8d, forming a protective layer 124 on the gate electrode 122. As illustrated in FIG. 8e, forming a spacer 128 on the black matrix 123.

For example, in the manufacturing method of the display device provided by an example of the present embodiment, which further includes: injecting the liquid crystal between the assembled array substrate and the opposing substrate. The step of cell-assembling the array substrate and the opposing substrate includes injecting the liquid crystal in a vacuum environment, so as to improve the precision of the cell assemble and further improve the yield of the manufacturing method of the display panel.

Third Embodiment

The present embodiment provides a display device. The display device includes the abovementioned display panel. Because of the display device includes the abovementioned display panel, the display device has the technical effect corresponding to the technical effect of the display panel included in the display device, which is not described in detail in the present embodiment.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In a case of no conflict, features in one embodiment or in different embodiments can be combined.

The foregoing is only the embodiments of the present invention and not intended to limit the scope of protection of the present invention, and the protection scope of the present disclosure should be based on the protection scope of the claims.

The present application claims priority of China Patent application No. 201611220093.4 filed on Dec. 26, 2016, the content of which is incorporated in its entirety as portion of the present application by reference herein.

What is claimed is:

1. A display panel, comprising:
an array substrate, comprising a first base substrate and a source electrode, a drain electrode and an active layer which are disposed on the first base substrate, and a passivation layer disposed on the source electrode, the drain electrode and the active layer; and
an opposing substrate, disposed opposite to and spaced apart from the array substrate and comprising a second base substrate,
wherein the active layer comprises a source electrode region, a drain electrode region and a channel region between the source electrode region and the drain electrode region, the opposing substrate further comprises a gate electrode disposed on the second base substrate, the gate electrode is disposed opposite to and spaced apart from the passivation layer at a position where the channel region is located,
the gate electrode, the source electrode, the drain electrode, and the active layer constituting one thin film transistor,
the opposing substrate further comprising: a protective layer, disposed on a side of the gate electrode close to the array substrate, the protective layer at a position where the gate electrode is located is disposed opposite to and spaced apart from the passivation layer at the position where the channel region is located,
the display panel is configured to be curved so that the protective layer at the position where the gate electrode is located is disposed in contact with the passivation layer at the position where the channel region is located.

2. The display panel according to claim 1, wherein the display panel is configured to be curved so as to decrease a space between the gate electrode and the passivation layer at the position where the channel region is located.

3. The display panel according to claim 1, wherein the protective layer at the position where the gate electrode is located is protruded from the opposing substrate and forms a protrusion, the passivation layer at the position where the channel region is located is concave to the first base substrate and forms a groove, the protrusion is configured to be inserted into the groove upon the display panel being curved.

4. The display panel according to claim 1, wherein the opposing substrate further comprising:
a plurality of color filters; and
a black matrix, disposed around each of the color filters,
wherein an orthogonal projection of the gate electrode on the second base substrate falls within an orthogonal projection of the black matrix on the second base substrate.

5. The display panel according to claim 4, wherein the plurality of color filters is arranged in an array, the opposing substrate further comprising:
a gate line, extending along a row direction of the array, and the gate line is overlapped with the color filters.

6. The display panel according to claim 4, wherein the opposing substrate further comprising:
a spacer, an orthogonal projection of the spacer on the second base substrate falls within the orthogonal projection of the black matrix on the second base substrate.

7. A display device, comprising the display panel according to claim 1.

8. A manufacturing method of a display panel, comprising:
forming a source electrode, a drain electrode, an active layer and a passivation layer on a first base substrate to form an array substrate, wherein the active layer comprises a source electrode region, a drain electrode region and a channel region between the source electrode region and the drain electrode region;
forming a gate electrode on a second base substrate to form an opposing substrate; and
cell-assembling the array substrate and the opposing substrate, and making a side of the first base substrate on which the source electrode, the drain electrode, the active layer and the passivation layer are formed face a side of the second base substrate on which the gate electrode is formed; and
curving the display panel to form a curved display panel so as to decrease a space between the gate electrode and the passivation layer at the position where the channel region is located
wherein the gate electrode is disposed opposite to and spaced apart from the passivation layer at a position where the channel region is located, the gate electrode, the source electrode, the drain electrode, and the active layer constituting one thin film transistor,
before curving the display panel to form the curved display panel, forming a protective layer on a side of the gate electrode away from the second base substrate, wherein the protective layer at a position where the gate electrode is located is disposed opposite to and spaced apart from the passivation layer at the position where the channel is located,
curving the display panel to form the curved display panel so as to decrease the space between the gate electrode and the passivation layer at the position where the channel region is located specifically comprising: curving the display panel to form the curved display panel so that the protective layer at the position where the gate electrode is located is in contact with the passivation layer at the position where the channel region is located.

9. The manufacturing method of the display panel according to claim 8, curving the display panel to form the curved display panel so as to decrease the space between the gate electrode and the passivation layer at the position where the channel region is located comprises:
upon the display panel being curved, controlling a curving degree of the display panel according to an electrical property of the source electrode, the drain electrode and the active layer.

10. The manufacturing method of the display panel according to claim 8, wherein cell-assembling the array substrate and the opposing substrate is performed in a vacuum environment.

11. A display panel, comprising:
an array substrate, comprising a first base substrate and a source electrode, a drain electrode and an active layer which are disposed on the first base substrate, and a passivation layer disposed on the source electrode, the drain electrode and the active layer; and
an opposing substrate, disposed opposite to and spaced apart from the array substrate and comprising a second base substrate,
wherein the active layer comprises a source electrode region, a drain electrode region and a channel region between the source electrode region and the drain electrode region, the opposing substrate further comprises a gate electrode disposed on the second base substrate, the gate electrode is disposed opposite to and spaced apart from the passivation layer at a position where the channel region is located,
the gate electrode, the source electrode, the drain electrode, and the active layer constituting one thin film transistor,
the passivation layer is located on a side of the source electrode and the drain electrode away from the first base substrate, the array substrate and the opposing substrate are cell-assembled to form a liquid crystal cell,
the display panel is configured to be curved so as to decrease a space between the gate electrode and the passivation layer at the position where the channel region is located.

12. The display panel according to claim 11, wherein the opposing substrate further comprising:
a protective layer, disposed on a side of the gate electrode close to the array substrate, the protective layer at a position where the gate electrode is located is disposed opposite to and spaced apart from the passivation layer at the position where the channel region is located.

13. The display panel according to claim 12, wherein the display panel is configured to be curved so that the protective layer at the position where the gate electrode is located is disposed in contact with the passivation layer at the position where the channel region is located.

14. The display panel according to claim 13, wherein the protective layer at the position where the gate electrode is located is protruded from the opposing substrate and forms a protrusion, the passivation layer at the position where the channel region is located is concave to the first base substrate and forms a groove, the protrusion is configured to be inserted into the groove upon the display panel being curved.

15. The display panel according to claim 11, wherein the opposing substrate further comprising:
a plurality of color filters; and
a black matrix, disposed around each of the color filters,
wherein an orthogonal projection of the gate electrode on the second base substrate falls within an orthogonal projection of the black matrix on the second base substrate.

16. The display panel according to claim 15, wherein the plurality of color filters is arranged in an array, the opposing substrate further comprising:
a gate line, extending along a row direction of the array, and the gate line is overlapped with the color filters.

17. The display panel according to claim 15, wherein the opposing substrate further comprising:
a spacer, an orthogonal projection of the spacer on the second base substrate falls within the orthogonal projection of the black matrix on the second base substrate.

18. The display panel according to claim 11, wherein the opposing substrate further comprising:
a protective layer, disposed on a side of the gate electrode close to the array substrate, the protective layer at a position where the gate electrode is located is disposed opposite to and spaced apart from the passivation layer at the position where the channel region is located.

* * * * *